United States Patent [19]

Vig

[11] 4,259,606
[45] Mar. 31, 1981

[54] FAST WARM-UP OVEN CONTROLLED PIEZOELECTRIC OSCILLATOR

[75] Inventor: John R. Vig, Colts Neck, N.J.

[73] Assignee: The United States of America as represented by the Secretary of the Army, Washington, D.C.

[21] Appl. No.: 42,654

[22] Filed: May 25, 1979

[51] Int. Cl.³ ............................................. H01L 41/08
[52] U.S. Cl. ..................................... 310/343; 310/344
[58] Field of Search .............. 310/341, 343, 344, 311, 310/312, 314, 315; 236/1 F; 219/210, 553

[56] References Cited

U.S. PATENT DOCUMENTS

| | | | |
|---|---|---|---|
| 1,746,125 | 2/1930 | Mirick | 310/343 X |
| 1,962,609 | 6/1934 | Nicolson | 310/311 X |
| 2,278,936 | 4/1942 | Lindsay et al. | 310/311 X |
| 2,969,471 | 1/1961 | Schneider | 310/343 |

Primary Examiner—Mark O. Budd
Attorney, Agent, or Firm—Nathan Edelberg; Jeremiah G Murray; Bernard Franz

[57] ABSTRACT

A process and apparatus are disclosed for heating a piezoelectric crystal resonator by infrared radiation.

13 Claims, 1 Drawing Figure

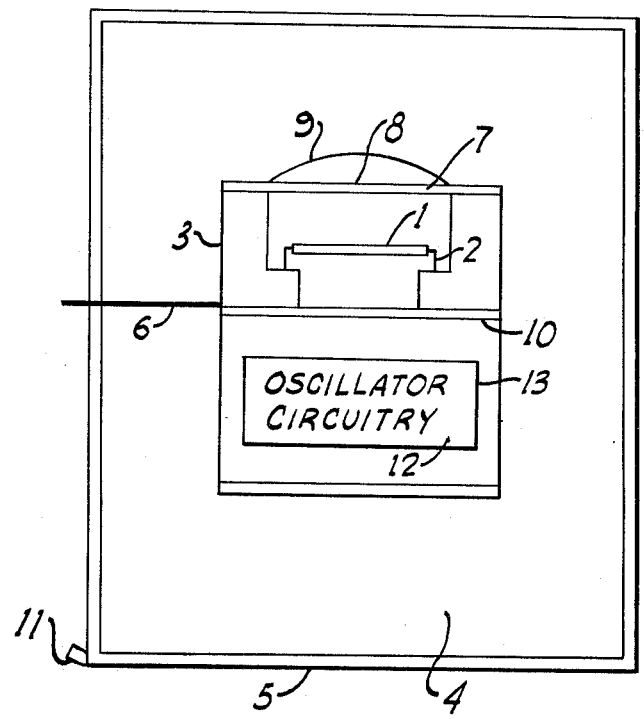

FAST WARM-UP OVEN CONTROLLED PIEZOELECTRIC OSCILLATOR

The invention described herein may be manufactured and used by or for the Government for governmental purposes without the payment of any royalties thereon or therefor.

BACKGROUND OF THE INVENTION

The present invention relates to a process for fast warm-up of piezoelectric crystal plates and an apparatus for practicing the process. More specifically, the invention relates to a fast warm-up, oven controlled oscillator assembly.

It is well known that the resonant frequency of crystal resonators varies with temperature. The magnitude of this variation depends upon a number of factors, including the type of crystal used, and the angles of cut of the crystal. Since most applications of crystal oscillators require stable frequencies, it is necessary to control or compensate for the temperature effects.

One method of minimizing the temperature effects employs temperature compensated crystal oscillators. As is well known in the art, such oscillators minimize the temperature effects by means of external circuitry, such as the combination of a thermistor network and one or more varactors. Such circuitry can compensate for most of a crystal's frequency changes with temperature.

The highest possible stability is achieved by operating the crystal in an oven controlled oscillator. In such an oscillator, the temperature of the crystal is maintained constant in an oven. The temperature of the oven is set to a "turnover point", i.e., a point where the crystal's frequency versus temperature curve has zero slope.

A number of types of such oven controlled oscillators are known. Generally, the crystals in the ovens are heated by conduction. For example, Ho et al., *Proceedings of the 31st Annual Frequency Control Symposium,* pages 421–428, (1977), discuss the thermal design of an oscillator using a double oven in which a booster oven in addition to a conventional dual oven is used for fast repeatable warm-up characteristics. The oscillator and crystal are said to be enclosed in the ovens which in turn are mounted within a Dewar flask. The arrangement is illustrated on page 423 in FIG. 2 of the article. The warm-up characteristics of the arrangement at 25° C. are said to be $5 \times 10^{-9}$ at 6.8 minutes after turn-on.

Also, in the same volume of *Proceedings of the 31st Annual Frequency Control Symposium,* pages 3–16, (1977), Kusters et al. discuss the use of a thermal transient compensated crystal cut in combination with a fast warm-up oven which is said to reach its operating temperature in 300 seconds. In addition, Babbit in *Proceedings of the 31st Annual Frequency Control Symposium,* pages 412–420, (1977), discusses an oven for piezoelectric crystals which is a single oven with rigid closed-cell freon-filled urethane foam insulation, which again heats the crystal blank by conduction. FIG. 4 on page 417 of the Babbit article illustrates the oven details.

Tinta et al. in *Proceedings of the 24th Annual Frequency Control Symposium,* pages 157–163 (1970), disclose contact heaters for crystal plates. The contact heaters consist of thin metallic films deposited on a crystal surface which are traversed by electric currents. Such contact heaters were said to require very short times for temperature stabilization; however, the experiments reported did not result in any commercial products. The approach was abandoned, probably due to the fact that the crystal blanks had to be heated in an anisotropic manner, which resulted in undesirable thermal transient effects.

The above-discussed methods for heating crystal resonators are subject to a number of disadvantages. As discussed above, conduction has been the mode of heating used to date. Thus, the enclosure containing the crystal is usually back-filled with an inert gas, such as helium or nitrogen, to operate as the heat conducting medium. Conduction is a relatively slow process, and warm-up for such ovens usually takes a relatively long period of time, e.g., 5 to 20 minutes. Since the inert gas often contains contaminants, problems with stability can occur. It would be preferable to be able to seal the crystal plate in a vacuum to get maximum stability and good insulation. However, because such ovens operate by conduction, the warm-up characteristics of vacuum sealed crystals are not very good. Moreover, a contact heater on the surface of the crystal plate produces undesirable thermal transient effects.

SUMMARY OF THE INVENTION

It has now been found that fast warm-up of a resonator can be provided by an apparatus comprising a piezoelectric crystal plate and a source of infrared radiation, the radiation being directed at the crystal plate and being of a wavelength absorbable by the crystal plate or by both the crystal plate and its electrodes. Such an arrangement heats primarily by irradiation, not conduction. Accordingly, the crystal can be warmed to the desired operating temperature very quickly, because the thermal time constant for conduction in the plate thickness direction is very small. For example, for quartz crystals, the time constant, t, in seconds, may be expressed in terms of the plate frequency, $f_o$, in megahertz, for AT, FC, IT, SC, and rotated-X-cuts by the formula $$t = 0.271/f_o^2 (MHz) \text{ sec.}$$

Thus, for example, the time constant for a 10 MHz fundamental mode resonator is only 2.71 milliseconds, and for a 5 MHz 5th overtone resonator it is 0.271 seconds. If the optimum operating temperature of the crystal is 130° C. above the minimum operating temperature of the oscillator, then if energy can be supplied to the crystal fast enough, a maximum of seventeen time constants would be required to heat the crystal to within one millidegree of the optimum temperature. Thus, the maximum warmup time of such an oscillator could range from 46 milliseconds for a 10 MHz fundamental mode resonator to 4.6 seconds for a 5 MHz 5th overtone resonator.

Similarly, the energy required to heat a resonator to its operating temperature would be very small. For example, to heat a quartz plate from −40° C. to +90° C., the energy required is given by 272 watt-seconds times the volume of the plate in cubic centimeters. Thus, to heat a 10 MHz fundamental mode 8 mm diameter plate from −40° to +90° C., 2.3 watt-seconds are required, and to heat a 5 MHz 5th overtone 15 mm diameter plat through the same temperature range, 80 watt-seconds are required.

Moreover, the present apparatus allows the use of a vacuum as the insulating means, in both the crystal enclosure and oven enclosure. Thus, the apparatus requires low power output from the infrared source. Furthermore, as is explained below, even if a vacuum is lost in the apparatus of the invention, it is not catastrophic, but merely requires that about three times more power be directed to the infrared source to maintain the temperature desired.

A preferred embodiment of the present invention is an oven controlled oscillator assembly comprising an oven enclosure, a piezoelectric crystal resonator within the oven enclosure, means for holding a crystal plate in the crystal resonator enclosure, an oscillator circuitry which makes the piezoelectric crystal plate vibrate at a resonant frequency, an infrared source emitting radiation at least part of which is directed at the crystal plate, said radiation being of wavelengths absorbable by the crystal plate or by both the crystal plate and its electrodes, means for controlling the emission from the infrared source so as to reach and maintain the crystal plate at a predetermined temperature, means for thermally insulating the crystal plate, oscillator circuitry, and temperature control circuitry from the environment outside the oven enclosure, and means for evacuating the assembly.

Piezoelectric crystal plates suitable for use in the present invention include all bulk wave resonators, surface acoustic wave resonators, and surface skimming bulk wave resonators. Examples of piezoelectric crystals include quartz, berlinite, lithium niobate and lithium tantalate. Examples of particularly appropriate bulk wave resonators include quartz crystals of the AT, FC, SC, RT and BT-cut varieties. The preferred quartz crystal is the SC-cut because it is thermal transient compensated. The preferred examples of surface acoustic wave (SAW) resonators, and surface skimming bulk wave (SSBW) resonators will be the cuts which are either thermal transient compensated, or which exhibit the minimum thermal transient response. The cuts which exhibit the minimum thermal transient response in SAW and SSBW resonators have not yet been identified. Designs which are also suitable for use in the present invention are electrodeless BVA-type designs similar to those described by Raymond J. Besson in the *Proceedings of the* 31*st Annual Symposium on Frequency Control,* (1977).

In conventional crystal resonators the crystal plates are mounted in the crystal enclosure on mounting clips which are made of a metal, such as nickel. Such mounting clips are designed to provide the proper mechanical support and good electrical and thermal contact to the crystal plate. In the present invention, it is desirable to have minimum thermal contact between the crystal plate and the outside environment. Thus, crystal mounting supports having good thermal insulation characteristics are desired. Preferably, the mounting supports also provide electrical contact to the crystal plate. For example, mounting supports made of insulating materials such as polyimide, glass, quartz, or sapphire which are coated with a thin conductive film or contain an electrically conducting substance such as gold can be used. The electrically conducting substance in such a mounting clip acts as the means for making electrical contact to the crystal plate.

Other means for making electrical contact to the piezoelectric crystal plate are well-known in the art. For example, subsequent to bonding the crystal plate to the thermally insulating mounting clips, electrical contact to the plate can be established by means of thin thermocompression bonded gold wires, which connect gold metallized pads on the crystal plate to gold metallized areas on the crystal enclosure.

Many infrared sources emitting radiation of wave lengths absorbable by a piezoelectric plate or its electrodes are known. For example, if a quartz crystal resonator is used, a source emitting a high proportion of radiation having wavelengths above 3.5 microns is desirable. Suitable infrared (IR) sources include graphite, silicon carbide and boron nitride (BN). The preferred IR source is a selective emitter such as an electrically heated high purity boron nitride source. The electrical heating means can be a current passing through a graphite or tungsten core. The boron nitride can be deposited by, for example, chemical vapor deposition. Unlike most other materials, boron nitride has a spectral emittance particularly suited to efficient operation at above 3.5 microns, somewhat independent of temperature, along with superior high temperature properties. The efficiency of BN results from its low emittance at short wavelengths (visible to 3 microns) and an emittance approaching unity at 3.5 to 5.7 microns. The nonuniform spectral emittance of BN results in three potential advantages as described below.

First, BN emits less nonuseable radiation at short wavelengths (visible to 3.5 microns) than a blackbody or graybody, such as graphite, at the same temperature. This results in converting a higher percentage of the electrical heater power into mid-IR radiation.

Second, a BN source operates at a higher temperature than would an identical graphite source operated under the same conditions because the total emissivity of BN is lower than graphite. Thus, for the same source size, a significantly higher output above 3.5 microns can be achieved with the BN source.

Third, the wavelength distribution of the output from a given radiant source is the product of the normal blackbody distribution multiplied by the normal spectral emittance of the source material. The emittance of BN peaks about 5 microns relatively independent of temperature, while the peak of the blackbody curve varies with temperature. Thus, for example, even when a boron nitride source is operated at 1600° C., about half the radiation emitted is at wavelengths above 3.5 microns and is thus absorbed by quartz. At lower temperatures, an even larger proportion is emitted at the longer wavelengths.

The IR source would be placed in close proximity to an IR transmitting window on the crystal enclosure. The infrared source can also be applied as a film on a window looking into the crystal enclosure containing the crystal plate. Such windows must, of course, transmit most, if not all, of the infrared radiation which is to be absorbed by the crystal plate. Suitable windows include anti-reflection coated sapphire, calcium fluoride, silver chloride, potassium bromide, chalcogenide, and germanium. Leads are attached to the film on the window and an electric current is applied to produce the desired infrared radiation. In the preferred embodiment, the crystal plate is enclosed in a ceramic flatpack, one or both lids of which contain an infrared window. The flatpack is preferably sealed in vacuum.

In order to maintain the crystal plate at a constant temperature in the oven-controlled oscillator assembly, means are provided for controlling the emission from the infrared source so as to maintain the crystal plate at a predetermined temperature. For example, the resistance of a thin metallic film, such as platinum, deposited onto the crystal plate can be used to sense the temperature of the crystal plate. The feedback from this resistance temperature sensor can be used to control the emission from the IR source. Alternatively, if a doubly rotated crystal plate, such as the SC-cut of quartz is used, then the b-mode of such a resonator can act as a temperature sensor, i.e., the crystal can be its own thermometer. Such a technique is similar to that described by J. A. Kusters and J. G. Leach on pages 389 and 397 of the *Proceedings of the 32nd Annual Symposium on Frequency Control* (1978).

Any of the known means for thermally insulating the piezoelectric resonator and the oscillator-temperature control circuitry from the environment outside the oven enclosure can be used in the present invention. Suitable materials for insulating the oven enclosure include polystyrene foam, vacuum dewar, superinsulating composite systems consisting of highly reflecting metal or metallized plastic foils separated by fine powder or fibrous insulation, and a variety of microporous insulations. Preferably, a vacuum is used in combination with microporous insulation to provide the thermal insulation within the oven enclosure.

To mimimize the oven size while maintaining higher stability, microporous silica-based insulation materials, such as Min-K or Microtherm, are preferably used. (Min-K thermal insulations are manufactured by the Johns-Manville Corp., Denver, Colorado; and Microtherm is manufactured by Micropore Insulations Ltd., Merseyside, England.) These materials have low thermal conductivities. For example, the thermal conductivity of Microtherm at one torr pressure is about $6 \times 10^{-5}$ W/cmK at 0° C. and $8 \times 10^{-5}$ W/cmK at 100° C. A major advantage of such insulations is that, even if a vacuum is used and it fails, the thermal conductivities increase by less than a factor of three as the pressure in the oven increases from 1 torr to 1 atmosphere. Moreover, these materials can be outgassed at high temperatures.

As discussed above, in the preferred embodiment of the present invention, the infrared source is in close proximity to a window which transmits radiation of the wavelengths which are absorbable by the piezoelectric crystal plate. In this manner, a window with an infrared source deposited upon it, or attached in close proximity to it, is placed above the piezoelectric crystal plate and the emissions from the source are directed at the plate.

Preferably, a reflector is placed about the IR-source to direct the radiation toward the crystal plate. Suitable reflector materials include aluminum, silver, gold and copper. The reflector is shaped so as to reflect the infrared energy onto the crystal plate as uniformly as possible. In conventional bulk-wave resonators, the electrode tabs should be oriented along the directions which minimize the thermal transient effect caused by anisotropic heating due to the difference in absorbance between the electrodes and the crystal. To further minimize the thermal transient effects due to the tabs, the tabs can be made narrow and can also have slots through which the infrared radiation can pass. A BVA crystal would be particularly well-suited for use in the present invention, since such a crystal has no electrodes deposited onto the surfaces of the crystal, and it thus can be heated very uniformly by IR radiation.

The oven-controlled oscillator assembly of the present invention can operate in a large range of temperatures, e.g., from −50° C. to +85° C. Preferably, the temperature of the piezoelectric crystal plate should be at least 15° C. above the maximum ambient temperature, e.g., 100° C.

BRIEF DESCRIPTION OF THE DRAWING

The FIGURE represents a cross-sectional view of an oven controlled oscillator assembly in accordance with the present invention.

DETAILED DESCRIPTION OF THE INVENTION

The invention is best described with reference to the FIGURE which shows one embodiment of an apparatus in accordance with the present invention. The piezoelectric crystal plate 1, such as a stress-compensated or thermal-transient compensated cut quartz plate, is suspended by means of thermally insulating mounts 2 in a ceramic flat pack crystal enclosure 3. The mounts 2 also have deposited on them thin films of electrically conducting leads for making electrical contact to the crystal plate 1. The ceramic flat pack 3 is surrounded by insulating material 4, such as a microporous insulation, contained in an outer metallic oven enclosure 5 having a pinch-off tube 11 via which a vacuum can be applied to the insulation material 4 to improve the insulation characteristics. The leads from mounts 2 are connected to the oscillator and temperature control circuitry 12, and electrical power is applied to the oscillator circuitry from outside the metallic enclosure 5 by leads 6 which can be metallized polyimide film leads. The ceramic flat pack 3 has an IR transmitting window 7 which can also operate as a lid for the flat pack. The window 7 is composed of a material such as sapphire which can transmit a sufficient portion of the infrared radiation which is desired to be absorbed by the crystal plate. An infrared deposited on the window so that radiation from t will be directed at the crystal plate. A reflector 9, e.g., of aluminum, is placed over the source to reflect any radiation toward the crystal plate. The oscillator and temperature control circuitry can be included in a second flatpack 13 below the flatpack lid 10. Such an apparatus has been found to provide fast warm-up characteristics without any loss in the stability characteristics of the oscillator.

The following example is included to exemplify but not to limit the present invention.

EXAMPLE 1

The oscillator assembly contains a ceramic flatpack enclosed SC-cut quartz crystal. Both lids of the flatpack include anti-reflection coated calcium fluoride windows. In close proximity to each window, small boron nitride coated graphite IR sources are located. Both sources have gold plated reflectors which direct the IR energy uniformly onto both sides of the crystal plate. During warmup of the assembly, the IR source is heated rapidly to about 1,600° C. A proportional control circuit decreases the current passing through the IR source as the b-mode frequency of the crystal approaches the value that corresponds to the desired operating temperature. The crystal plate is supported by means of three thermally insulating thoroughly outgassed polyimide mounting clips, two of which are coated with a thin gold film strip for electrical contact to the crystal. The three mounting clips are oriented along the directions which minimize the thermal transient effect due to heat losses through the clips. The resonator-IR source loop has a very short thermal time constant, whereas the resonator-external environment has a very long time constant. The resonator-IR source assembly and the oscillator circuitry are together embedded in previously outgassed Min-K TE 1400 microporous thermal insulation while in a dry inert gas atmosphere. The electrical leads of the oscillator, made of thin gold film strips deposited onto a polyimide film substrate, are attached to glass to metal feedthroughs of the metal outer enclosure. The metal outer enclosure is sealed by resistance welding, and is evacuated, through a pinch-off tube, to a pressure of less than $10^{-5}$ torr. The assembly can be heated during evacuation to facilitate outgassing. The pinch-off tube is then sealed.

What is claimed is:

1. An oven controlled oscillator assembly comprising an evacuated ceramic flatpack crystal enclosure, a piezoelectric crystal plate within said crystal enclosure, a piezoelectric crystal plate within said crystal enclosure, thermally insulating means mounting said crystal plate in said crystal enclosure, said crystal enclosure having at least one lid which includes an infrared transmitting window, an infrared source in close proximity to said window outside of said crystal enclosure to emit radiation through the window to said crystal plate, a reflector mounted as a dome over said window with said infrared source between the window and the reflector, said radiation being of wavelengths absorable by said crystal plate, means including temperature sensing means on said crystal plate and temperature control circuitry for controlling the emission from the infrared source so as to maintain said crystal plate at a predetermined temperature, oscillator circuitry and means for thermally insulating said crystal plate and oscillator circuitry from the environment outside said assembly, whereby the assembly has a very small thermal time constant for fast warmup of the crystal plate, and a very large thermal time constant to give insensitivity to outside environmental changes.

2. Apparatus according to claim 1, wherein said piezoelectric resonator is a bulk-wave quartz resonator, the crystal plate is an SC-cut quartz crystal, and wherein said temperature sensing means comprises use of the b-mode in which the resonator acts as its own temperature sensor.

3. Apparatus according to claim 1, wherein said crystal resonator is selected from the group consisting of a thermal transient compensated resonator, a bulk wave resonator, a surface acoustic wave resonator, and a surface skimming bulk wave resonator.

4. Apparatus according to claim 1, wherein said piezoelectric crystal plate is a thermal transient compensated crystal cut.

5. Apparatus according to claim 1, wherein said source emits a high proportion of radiation above 3.5 microns.

6. Apparatus according to claim 1, wherein said source is selected from the group consisting of graphite, silicon carbide and boron nitride.

7. Apparatus according to claim 1, wherein said source is boron nitride.

8. An assembly according to claim 1, wherein electrically conductive thin film strips forming electrode tabs to said crystal plate are formed on said thermally insulating means mounting said crystal plate, the electrode tabs being oriented along the directions which minimize the thermal transient effect caused by anistropic heating due to the difference in absorbance between the electrodes and the crystal.

9. An assembly according to claim 1, which also includes a second evacuated flatpack enclosure mounted adjacent said crystal enclosure, said oscillator circuitry being enclosed within the second enclosure, and an outer evacuated metallic enclosure within which said crystal enclosure and the second enclosure are mounted, said means for thermally insulating being microporous insulation within said outer metallic enclosure.

10. An assembly according to claim 9, wherein said piezoelectric crystal plate is a thermal transient compensated crystal cut.

11. An assembly according to claim 9, wherein said infrared source is boron nitride.

12. An assembly according to claim 9, wherein said temperature sensing means comprises a thin metallic film deposited onto said crystal plate whose resistance is sensed by said temperature control circuitry.

13. An assembly according to claim 12, wherein said thin metallic film is platinum.

* * * * *